United States Patent
Buchwalter et al.

(10) Patent No.: US 7,516,879 B1
(45) Date of Patent: Apr. 14, 2009

(54) METHOD OF PRODUCING COAXIAL SOLDER BUMP CONNECTIONS USING INJECTION MOLDING OF SOLDER

(75) Inventors: Stephen L. Buchwalter, Hopewell Junction, NY (US); Steven A. Cordes, Yorktown Heights, NY (US); Peter A. Gruber, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/166,481

(22) Filed: Jul. 2, 2008

(51) Int. Cl.
*B23K 31/00* (2006.01)
*B23K 31/02* (2006.01)

(52) U.S. Cl. .................. 228/180.22; 438/108

(58) Field of Classification Search .............. 228/179.1, 228/180.1, 180.22
See application file for complete search history.

(56) References Cited

U.S. PATENT DOCUMENTS

| | | | |
|---|---|---|---|
| 5,244,143 A | 9/1993 | Ference et al. | |
| 5,347,086 A | 9/1994 | Potter et al. | |
| 6,239,385 B1 | 5/2001 | Schwiebert et al. | |
| 6,388,198 B1 | 5/2002 | Bertin et al. | |
| 7,098,540 B1 | 8/2006 | Mohan et al. | |
| 2007/0178625 A1* | 8/2007 | Danovitch et al. | .......... 438/108 |

* cited by examiner

*Primary Examiner*—Kiley Stoner
*Assistant Examiner*—Nicholas P D'Aniello
(74) *Attorney, Agent, or Firm*—Scully, Scott, Murphy & Presser, P.C.; Daniel P. Morris, Esq.

(57) ABSTRACT

A method of forming coaxial solder bumps, which, in essence, provide rigid supports, with the use of hole-producing stencils being formed on a polymer insulator on a sacrificial substrate, wherein posts are formed within a ring structure. The holes are then filled with solder utilizing injection molding of solder, whereby both the ring and post are filled with solder, but are electrically insulated from each other, so as to provide inner and outer coaxial connections.

1 Claim, 1 Drawing Sheet

METHOD OF PRODUCING COAXIAL SOLDER BUMP CONNECTIONS USING INJECTION MOLDING OF SOLDER

BACKGROUND OF THE INVENTION

1. Field of the Invention

The present invention generally pertains to the injection molding of solder, and more particularly relates to a method of producing coaxial solder bump connections used in a solder bumping process, concurrently creating rigid supports therefrom.

2. Discussion of the Prior Art

In modern semiconductor devices, the ever-increasing electronic component densities on the devices and reduced dimensions of the devices demand more stringent requirements in the packaging or interconnecting techniques thereof. Generally, a known flip-chip attachment method has been used in the packaging of IC chips, wherein a formation of solder balls was carried out by an evaporation method of lead and tin through a mask for producing the desired solder balls. Another method employs electroplating of solder, which requires large volumes of chemical baths and which is especially hazardous due to the fact that many solders contain lead.

Another known method for depositing solder balls is solder paste screening. However, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself, in that this is generally composed of a flux and solder alloy particles. The consistency and uniformity of the solder paste composition becomes more difficult to control with a decreasing solder bump volume.

A more recently developed injection molded solder ("IMS") technique has improved upon the foregoing methods by dispensing molten solder instead of solder paste, such as in U.S. Pat. No. 5,244,143, which is commonly assigned to the assignee of the present application, discloses the fundamentals of the injection molded solder technique, and the disclosure of which is incorporated herein by reference in its entirety. One of the advantages of the IMS technique is that there is very little volume change between the molten solder and the resulting solder bump, and wherein the IMS technique may utilize a solder head that fills boro-silicate glass molds.

Applying a molten solder to a substrate in a transfer process step then implements the IMS method for solder bonding. When smaller substrates, i.e., chip scale or single chip modules are employed, the transfer step is readily accomplished since the solder-filled mold and substrate are relatively small in area and thus can be easily aligned and joined in a number of configurations. For instance, a process of split-optic alignment is frequently used in joining chips to substrates, whereby the same process may also be used in order to join a chip-scale IMS mold to a substrate (chip) which is to be bumped. The solder, which is applied to semiconductor wafers for flip chip bonding, forms the electrical connection between the device substrate (i.e., silicon chip) and the package (e.g. ceramic module, organic package, etc), as well as providing the mechanical connection between the device and the package. The mechanical properties of the connection are controlled by the properties of the materials, such as tensile strength, ductile strength and surface tension. These properties also play a role in a so-called standoff height, i.e., the separation between the two substrates. Under no-load conditions, this standoff will be largely controlled by the surface tension of the material. However, as the load increases, the standoff will be decreased to the point of contact between the nearest points, such that can reduce the integrity of the connection between the components.

SUMMARY OF THE INVENTION

Accordingly, in order to obviate the drawbacks of the prior art, there is provided a unique method of forming coaxial solder bump connections, which are particularly advantageous for purposes of high speed applications; wherein one of the primary advantages resides in preventing noise and crosstalk from affecting signals.

Pursuant to the present invention, there are formed coaxial solder bumps, which, in essence, provide rigid supports, with the use of stencils being formed on an insulator on a sacrificial substrate, wherein posts are formed within a ring structure. This particular stencil is then filled utilizing injection molding of solder, whereby both the ring and post are filled with solder, but are electrically insulated from each other.

Accordingly, it is an object of the present invention to provide a novel method of producing coaxial solder bump structures forming rigid supports through an injection molding process.

BRIEF DESCRIPTION OF THE DRAWINGS

Reference may now be made to the following detailed description of a preferred embodiment of the invention; taken in conjunction with the accompanying drawings; in which.

DETAILED DESCRIPTION OF THE INVENTION

Figure 1B:
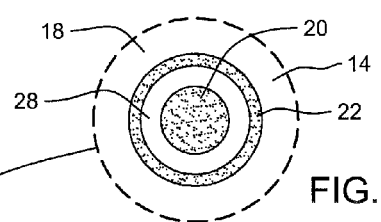
FIGS. 1a through 1e illustrate sequential method steps in forming the coaxial solder bump connections pursuant to the invention.
Figure 1A:
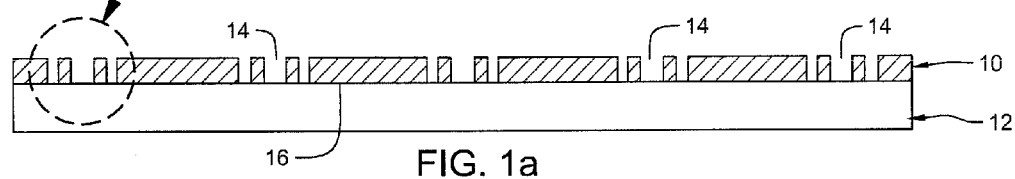

Referring now in more specific detail to the drawings, FIG. 1a illustrates a structure 10 for forming coaxial solder bumps, wherein this structure can be utilized on a sacrificial substrate 12, or even directly on the substrate of a semiconductor device (not shown).

As illustrated in FIG. 1a, the support substrate 12, which may be constituted of borofloat glass, or a substrate of a semiconductor device, is coated with a structure comprising a thick layer of a polymer 10, which may be within the range of about 25-100 microns, such as, for example, Kapton (Registered Trademark) or polyamide, or others. This process can be simply implemented, as is known in the technology.

Suitable holes 14 are drilled through the polymer 12, such as by means of laser ablation or reactive ion etching (RIE), down to the contacted surface 16 of the glass or sacrificial substrate 12. These particular holes 14, as shown in the enlarged top plan view of FIG. 1b, each define a concentric arrangement 18 forming the shape of a center via or post 20 surrounded by an annulus 22, and are distributed across the structure 12.

Figure 1C:
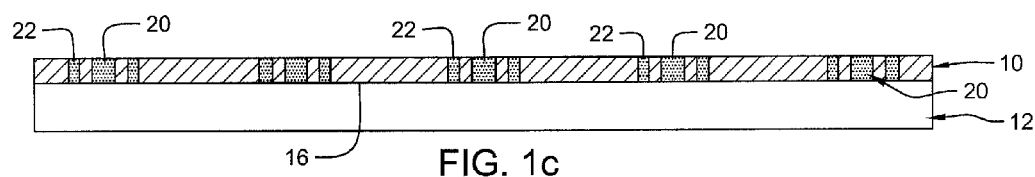

As illustrated in FIG. 1c of the drawings, these holes 14, in effect, both the via 20 and the annulus 22, are then filled with a conductive material 24, such as solder, as is well known in the art, for example, such as through injection solder molding, or the like.

Figure 1D:
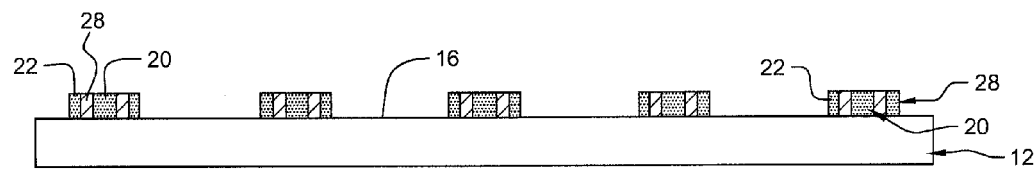

The polymer material 10 of the structure 12, which remains between the posts or vias 20, can then be removed by a suitable ablated release and mechanical removal process, as shown in FIG. 1d, leaving the surface 16 between the filled holes exposed, or alternatively, remain employed as an underfill material. In either case, the polymer material between the ring 22 and the post 20 will remain as an insulator between the two conductors. The outer ring conductor 22 can represent a separate signal-carrying bump, or may be a ground shield for the inner post conductor 20. This embodiment provides for the added benefit of producing two independent contacts separated by an insulator in a coaxial configuration, thereby imparting a significant improvement in capability.

By providing an inner signal connection surrounded by an outer ground connection, the outer ring will shield the inner ring from noise and cross-talk. This is an effective means of ensuring that the flip chip interconnects can scale down in size, while allowing an increase in frequency.

Figure 1E:
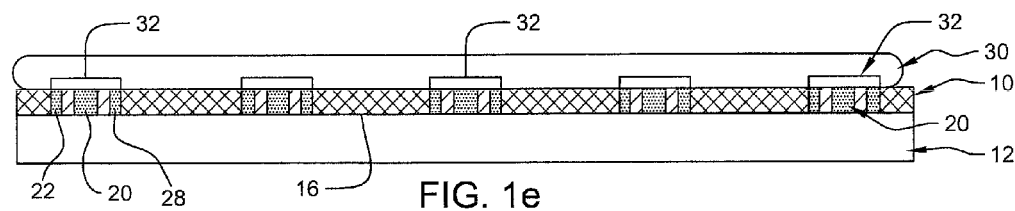

As shown in FIG. 1e, a wafer or chip 30 containing a plurality of contact pads 32 also having coaxial configurations (not shown) may then be positioned over the coaxial filled holes 12, so as to contact elements 20 and 22, and the sacrificial substrate 12 removed in due course, as shown in FIG. 1e, as may be required by specific customer applications.

The foregoing arrangement provides an additional benefit compared to the prior art, in that the coaxial connections 20, 22 allow for higher density applications, in effect, doubling the available number of inputs and outputs within a given or available surface area.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of producing coaxial solder bump connections using injection molding of solder, said method comprising:
   providing a substrate of a dielectric material;
   coating said dielectric substrate material with a patternable polymer with a desired thickness;
   forming a plurality of holes in said polymer through laser ablation or ion etching extending to the surface of said substrate, in predetermined spaced relationships, each of said holes defining a concentric arrangement forming a center via or posts surrounded by an annulus;
   filling the space about said center post or via and about said annulus with a solder through a solder injection molding process;
   selectively removing the polymer material from the regions located between said holes or maintaining the polymer material as an underfill; and
   contacting the post and annulus of each said hole forming coaxial inner and outer connections with coaxial contact pads on a semiconductor wafer or chip.

* * * * *